United States Patent
Bergman

(10) Patent No.: US 8,121,568 B2
(45) Date of Patent: Feb. 21, 2012

(54) RADIO FREQUENCY HANDLING DEVICE

(75) Inventor: Per Bergman, Fjärdhundra (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 377 days.

(21) Appl. No.: 12/446,148

(22) PCT Filed: Oct. 17, 2006

(86) PCT No.: PCT/SE2006/050408
§ 371 (c)(1),
(2), (4) Date: Apr. 17, 2009

(87) PCT Pub. No.: WO2008/048154
PCT Pub. Date: Apr. 24, 2008

(65) Prior Publication Data
US 2010/0317307 A1    Dec. 16, 2010

(51) Int. Cl.
*H04B 1/18*    (2006.01)
(52) U.S. Cl. ........ 455/191.1; 455/83
(58) Field of Classification Search ......... 455/63, 455/80–83, 120–125, 191.1–191.3; 333/1.1, 333/24.2
See application file for complete search history.

(56) References Cited

U.S. PATENT DOCUMENTS

| | | | | |
|---|---|---|---|---|
| 5,392,459 A | * | 2/1995 | Baba et al. | 455/69 |
| 5,701,595 A | * | 12/1997 | Green, Jr. | 455/83 |
| 6,812,686 B2 | * | 11/2004 | Chaoui | 324/95 |
| 7,265,643 B2 | * | 9/2007 | Toncich | 333/24.2 |

FOREIGN PATENT DOCUMENTS

| | | |
|---|---|---|
| EP | 0635936 A2 | 1/1995 |
| JP | 61121917 A | 6/1986 |
| JP | 06300803 A | 10/1994 |
| WO | WO9844661 A1 | 10/1998 |

* cited by examiner

*Primary Examiner* — Lincoln Donovan
*Assistant Examiner* — Diana J Cheng

(57) ABSTRACT

A radio frequency signal handling device and a mobile communication device comprising such a radio frequency signal handling device. The radio frequency signal handling device comprises a first terminal interfacing external entities in the form of an input where radio frequency signals are to be received, at least one signal scaling unit having a first end where a signal provided by a terminal interfacing external entities is received, and one signal detector provided for each signal scaling unit and being connected to a second end of the corresponding signal scaling unit for detecting a signal provided by this signal scaling unit. The signal scaling unit only includes passive reactive components and comprises at least one such passive reactive component.

10 Claims, 3 Drawing Sheets

RADIO FREQUENCY HANDLING DEVICE

TECHNICAL FIELD OF THE INVENTION

The present invention relates to the field radio frequency communication. More particularly the present invention relates to a radio frequency signal handling device and a mobile communication device comprising such a radio frequency signal handling device.

DESCRIPTION OF RELATED ART

In the field of mobile communication, mobile communication devices, like base stations and mobile stations, are normally provided with a radio transmission device comprising a power amplifier connected to an output via a one or more circulators, where the circulator provides isolation for the output power.

In order to regulate the output power, it is necessary to detect the output power generated by the amplifier. For this reason the radio transmission devices are provided with a directional coupler that couples a fraction of the power in one line into a parallel line, where the signal is detected to DC (rectified) from this parallel line and used for estimating the RF power level in order to regulate the output power.

However, these directional couplers are fairly expensive and there is also an RF loss involved with their use.

There is therefore room for improvement when coupling a part of a signal provided between a power amplifier and the output of a radio transmission device.

SUMMARY OF THE INVENTION

The present invention is directed towards providing an improved radio frequency handling device that can be obtained at reduced cost.

One object of the present invention is to provide a radio frequency signal handling device, which includes parts that are cheap to produce and where losses may be limited.

According to the present invention this is achieved by a radio frequency signal handling device comprising:
a first terminal interfacing external entities in the form of an input where radio frequency signals are to be received,
at least one signal scaling unit having a first end where a signal provided by a terminal interfacing external entities is received, and
one signal detector provided for each signal scaling unit and being connected to a second end of the corresponding signal scaling unit for detecting a signal provided by this signal scaling unit,
wherein the signal scaling unit only includes passive reactive components and comprises at least one such passive reactive component.

The radio frequency signal handling device may with advantage be provided in a radio transmission device such as a base station or a mobile station.

The invention has the following advantages. The signal scaling unit is cheap and simple to produce, which means that the total cost of the device may be reduced. It may here be provided as a part of a circuit board. The signal scaling unit furthermore has a fairly low loss, which is of advantage in some application where the invention may be used. The signal scaling unit is also insensitive to temperature change.

It should be emphasized that the term "comprises/comprising" when used in this specification is taken to specify the presence of stated features, steps or components, but does not preclude the presence or addition of one or more other features, steps, components or groups thereof.

BRIEF DESCRIPTION OF THE DRAWINGS

The present invention will now be described in more detail in relation to the enclosed drawings, in which.

DETAILED DESCRIPTION OF EMBODIMENTS

The present invention relates to a radio frequency handling device for handling radio frequency signals. A radio frequency handling device when provided in the form of a radio transmission device normally has a power amplifier feeding a generated signal in a connection to an antenna via a directional coupler and a pair of circulators. Here the circulators function to isolate the generated signal from load variations and from signals received by the antenna. The circulator furthermore reduces the backward intermodulation. The directional coupler on the other hand couples a fraction of the signal to a parallel connection where the signal fraction can be detected and used for control purposes. Such a directional coupler normally has a coupling factor of about 20-30 dB. Backward reflections of this signal are not coupled. However the directional coupler is a quite expensive component and may also introduce fairly high losses that it would be advantageous to reduce.

One aspect of the present invention is therefore directed towards providing the same functionality as the traditional radio transmission device, but where the above mentioned problems associated with the directional coupler have been addressed.

Figure 1:
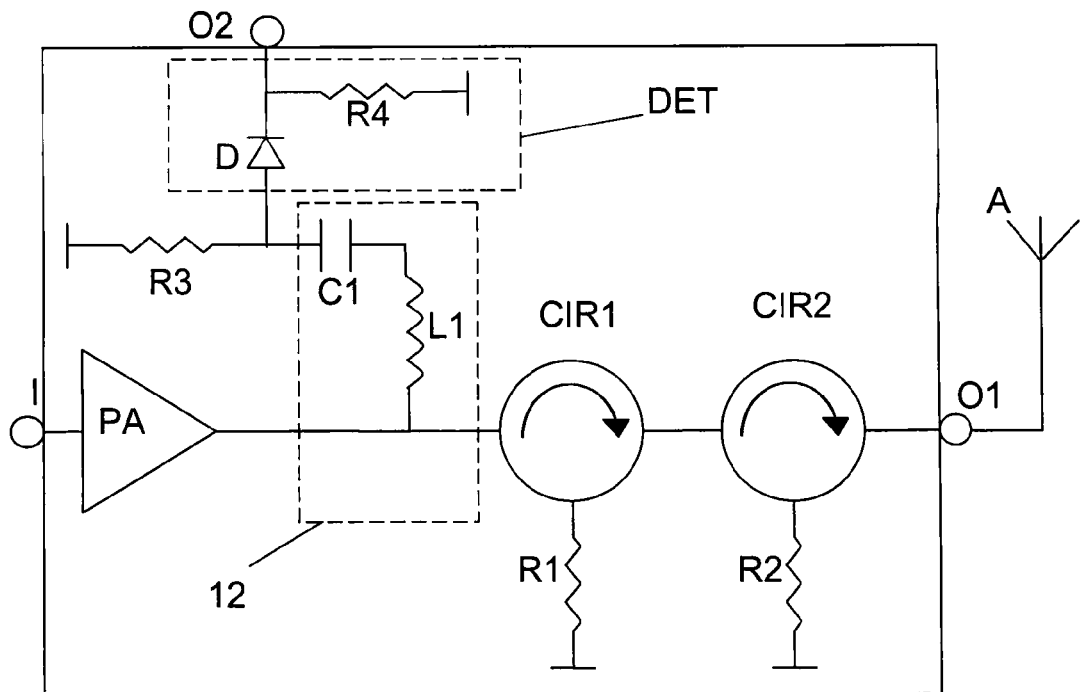
FIG. 1 shows a circuit diagram of a radio frequency signal handling device according to a first embodiment of the present invention in the form of a radio transmission device.

A radio frequency handling device in the form of a radio transmission device 10 is according to a first embodiment of the present invention shown in a circuit diagram in FIG. 1. The radio transmission device 10 includes an input I on which it receives a radio frequency signal from a signal generating unit (not shown). This input is connected to the input of a power amplifier PA, the output of which is connected to a first terminal of a first circulator CIR1. The first circulator CIR1 has a second terminal connected a first terminal of a second circulator CIR2 and a third terminal connected to ground via a first matching resistor R1. The second circulator CIR2 has a second terminal connected to a first output O1 of the radio transmission device 10 and a third terminal that is also connected to ground via a second matching resistor R2. The first output O1 is connected to an antenna A. A signal scaling unit 12, indicated by a dashed box, has a first end that is also connected to the first terminal of the first circulator CIR1 and a second end connected to the input of a signal detector DET as well as to ground via a third matching resistor R3. The detector DET, which is also indicated by a dashed box, here includes a diode D, the input of which is connected to the second end of the signal scaling unit 12 and the output of which is connected to a second output O2 of the device 10. The detector DET also includes a fourth resistor R4 connected between the second output O2 and ground. The signal scaling unit is finally made up of a first inductor L1 connected in series with a first capacitance C1. The input I and the first output O1 are here both terminals interfacing external entities, i.e. entities that are not part of the radio frequency signal handling device, like the above mentioned signal generating unit and the antenna A.

The functioning of the radio transmission device 10 is as follows. The radio transmission device 10 receives a radio frequency signal on the input I that is to be transmitted via the antenna A connected to the first output O1. Therefore the power amplifier PA amplifies this signal, which is then fed via the two circulators CIR1 and CIR2 to the antenna A. The two circulators CIR1 and CIR2 function to reduce radio signals received via the antenna A, so that these signals do not disturb the amplifier PA. They also create a constant load to the amplifier PA as well as provide a sufficient enough isolation for reflective waves because of a good match using the first and second matching resistances R1 and R2. A circulator typically has a VSWR (Voltage Standing Wave Ratio) of 1.15. Such signals and reflective waves are instead provided down to ground via the first and second resistors R1 and R2. Thus reverse waves are stopped from influencing the amplifier.

Because of this it is possible to provide the signal scaling unit 12 for coupling a fraction of the amplified radio frequency signal in a very simple way. It does thus not separate forward and reverse radio frequency waves as the known directional coupler. However this is not necessary as the circulators CIR1 and CIR2 provide enough isolation from backward waves. Therefore the signal scaling unit 12 of this first embodiment can be kept very simple and also efficient regarding the attenuation of the wave as compared with a directional coupler. Here the first capacitor C1 and first inductor L1 are chosen in size so that they provide an attenuation of about 15-25 dB of the signal in the frequency range in which the radio transmission device is to operate, which may be around 450 MHz. It should be realised that this frequency is a mere specific example and that any suitable radio frequency can be used instead. Here the Q-value of the inductor L1 influences the attenuation. The higher the Q-value is the smaller the losses will get. Losses for the whole unit 10 and the loss in the inductor L1 get smaller for higher Q-values. The signal scaling unit 12 has a certain variation in the attenuation in the frequency range in which the radio transmission device 10 is to operate. In the present example it is less than 1 dB for the frequency range associated with the 450 MHz frequency. However this variation may be removed when the output power control loop is calibrated in production. The passive reactive elements L1 and C1 are furthermore fairly insensitive to temperature changes, which may be of advantage in mobile communication that is carried out outdoors in changing weather conditions. The signal scaling unit 12 here couples a part of the amplified signal to the detector DET, where it may be detected and output via the second output O2 and used in controlling the amplification of the amplifier PA. This signal may thus be used in a known way in order to control the amplifier stage. The third matching resistance R3 is dimensioned to match the detector DET and typically has a value of about 50Ω. Also the first and second matching resistances R1 and R2 are dimensioned for a suitable matching of the circulators CIR1 and CIR2, which is normally the same value of 50Ω.

The signal scaling unit is not limited to be provided between a circulator and the amplifier. It can be used for other purpose.

Figure 2:
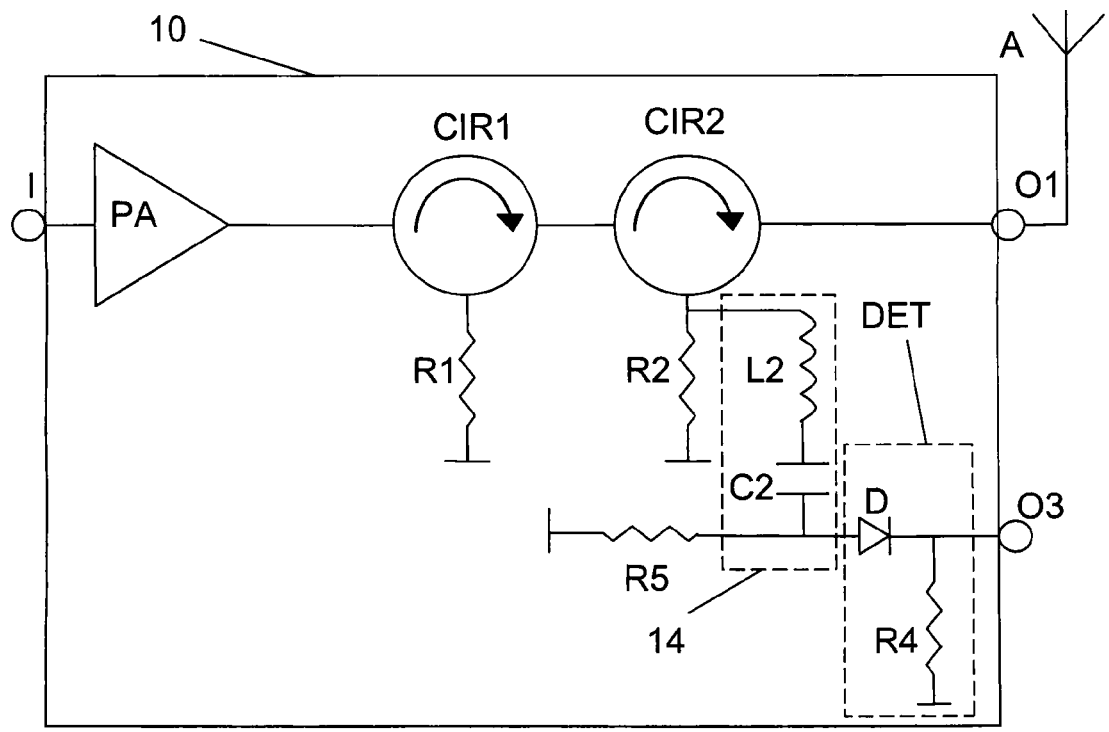
FIG. 2 shows a circuit diagram of a radio frequency signal handling device according to a second embodiment of the present invention in the form of a radio transmission device.

One such variation according to a second embodiment of the present invention is described in relation to FIG. 2. FIG. 2 shows essentially the same elements as FIG. 1. However, here a signal scaling unit 14 in series with a fifth matching resistor R5 is connected in parallel with the second matching resistor R2 for the second circulator CIR2. The signal scaling unit 14 here comprises a second capacitor C2 and a second inductor L2 selected in the same way as the first capacitor C1 and first inductor L1 were selected. The detector DET is here also connected to this signal scaling unit 14 in the same way as it was connected to the signal scaling unit 12 in FIG. 1. What is measured here is not the output power; it is rather the power reflected to the second circulator CIR2, which may include signals received and reflected by the antenna A.

It should here be realised that the two embodiments may be combined, i.e. be provided in a device that both measures the transmitted power as well as reflected power from the Antenna A. This allows the determination of the VSWR for the connected antenna in an efficient and cost-effective manner.

Figure 3:
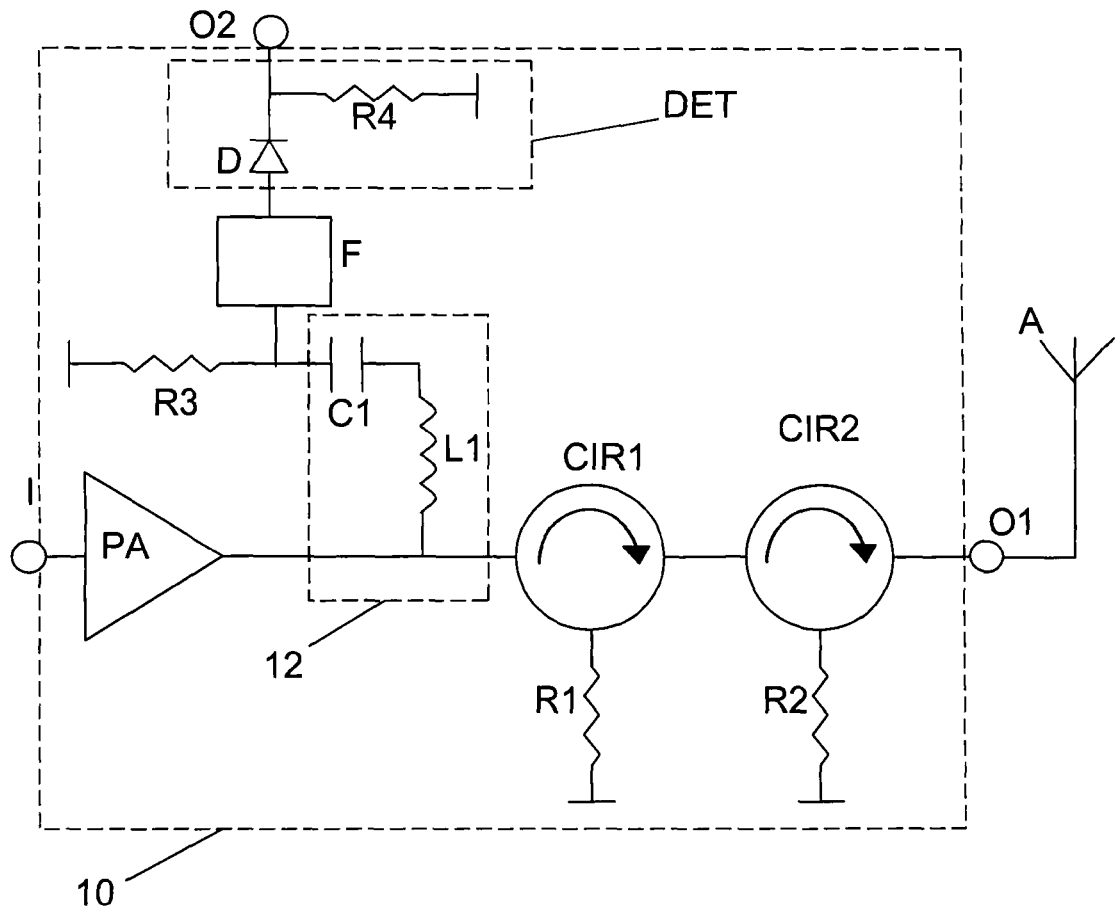
FIG. 3 shows a circuit diagram of a radio frequency signal handling device according to a third embodiment of the present invention in the form of a radio transmission device.

Another variation according to a third embodiment of the present invention is shown in FIG. 3, which is essentially the same as FIG. 1. The only difference is that there is provided a filter F between the signal scaling unit 12 and the detector DET. The filter F here serves to filter out harmonics of signals that are outside of the desired frequency range in order to provide a better detection.

Figure 4:
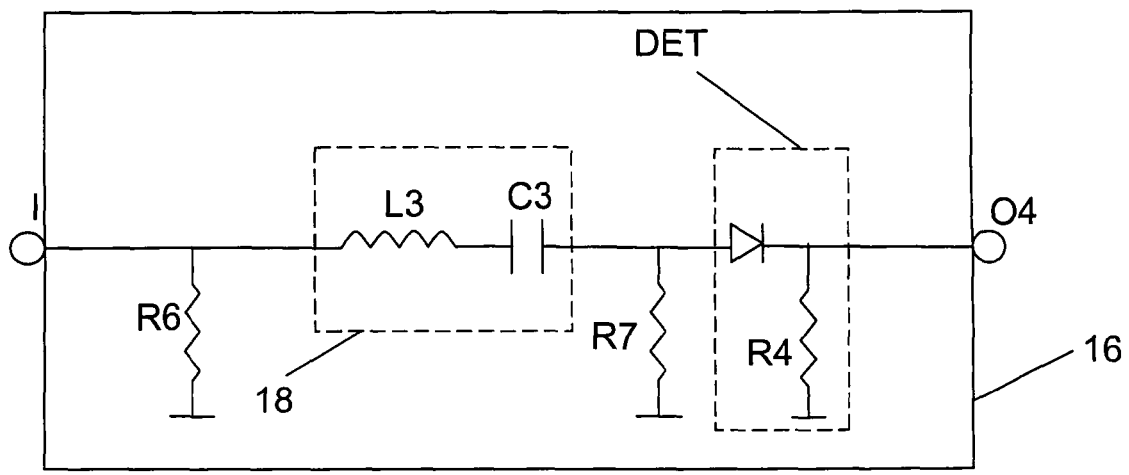
FIG. 4 shows a circuit diagram of a radio frequency signal handling device according to a fourth embodiment of the present invention in the form of a signal attenuating device, FIG. 5 schematically shows two mobile communication devices, one base station and one mobile station, communicating with each other, where each may include a radio frequency signal handling device according to the invention.

It is furthermore possible to use the signal scaling unit as an attenuator instead of an ordinary power attenuator. An example of this when the signal handling device is a signal attenuating device 16 according to a fourth embodiment of the present invention is shown in FIG. 4. Here there is an input I, which is connected to a signal scaling unit 18, which has the same configuration as the signal scaling units of FIG. 1-3, i.e. is provided with an inductor L3 in series with a capacitor C3. The signal scaling unit 18 is in turn connected to a detector DET of the same type as described in relation to the first to third embodiments, which in turn is connected to a fourth output O4. Here 50Ω matching resistances R6 and R7 are connected between the signal scaling unit 18 and the input I and between the signal scaling unit 18 and the detector DET, respectively. The input I is here supplied with an RF signal, which gets attenuated by the signal scaling unit 18 and then detected by the detector DET, which provides the detected signal on the output O4. The signal scaling unit 18 together with the power terminations R6 and R7 provides good attenuation at a lower price than ordinary attenuators for a narrowband frequency range when the RF-lines and terminations have a good VSWR. There is furthermore a lower power loss in the scaling unit 18 compared with a resistive attenuator.

The signal scaling unit according to the present invention can be varied in a number of ways. It may include only one passive reactive component instead of two, either an inductor or a capacitor. However an inductor is presently preferred, because the tolerances of the capacitors of today are inadequate for the frequency ranges of interest. However, if such tolerances can get improved in the future, also a single capacitor may be of interest. These passive reactive components are further more very simple and cheap to produce. They can for instance be provided as a part of a circuit board. This thus allows the device to become very economical to produce. The radio transmission device can also be varied, in that it may be possible to have only one circulator. It should also be realised that the detector is not limited to diode detectors, but may be any RF detecting unit that transforms an RF energy level to a DC voltage.

Figure 5:
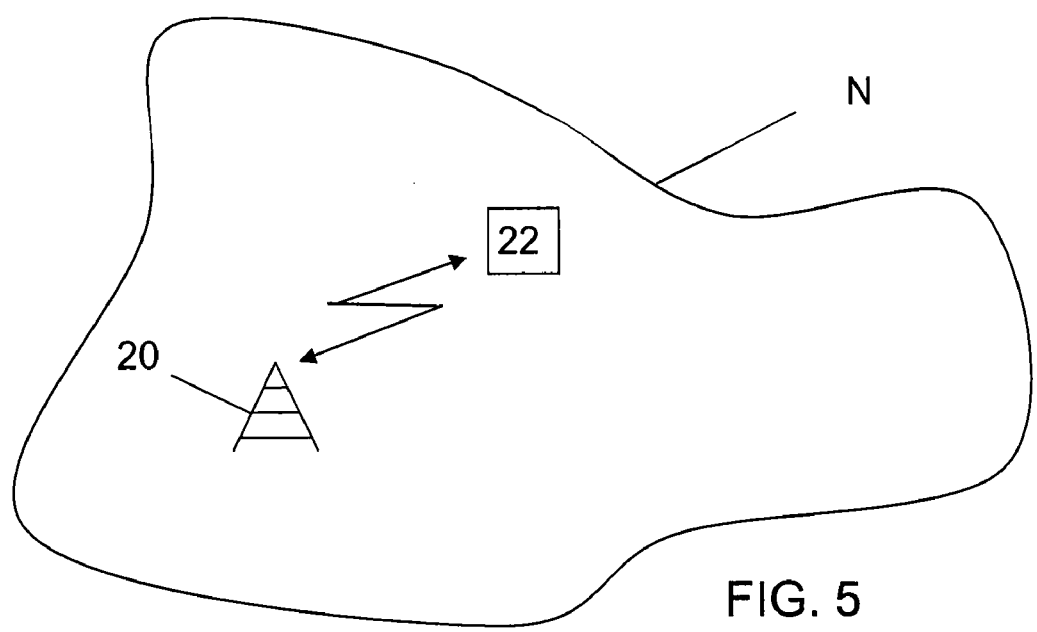
Figure 6:
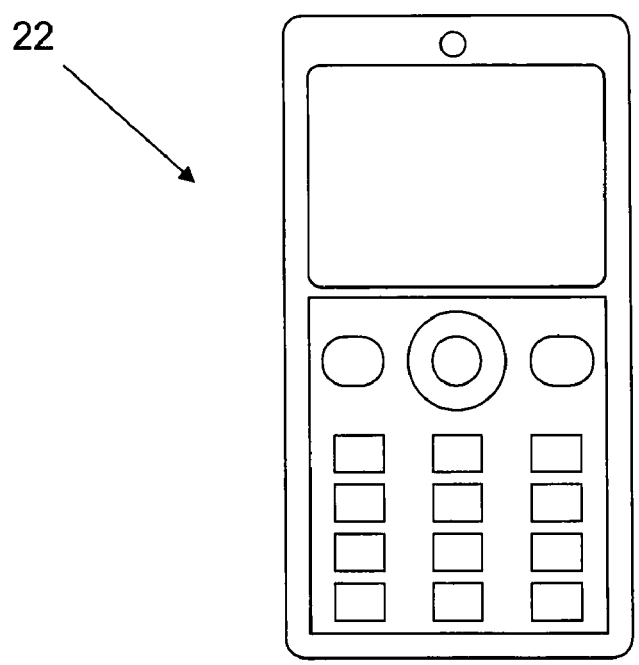
FIG. 6 shows a front view of a mobile station in the form of a cellular phone.

The radio frequency signal handling device according to the present invention may be provided in either a base station or a mobile station or in both. FIG. 5 schematically shows one such base station 20 communicating with a mobile station 22 in a wide area network N. Here both these are provided with a radio frequency signal handling device according to the invention. The mobile station 22 may here also be a cellular phone, which is shown in FIG. 6.

Although the present invention has been described in connection with specific embodiments, it is not intended to be limited to the specific form set forth herein. Rather, the scope of the present invention is limited only by the accompanying claims.

The invention claimed is:

1. A radio frequency signal handling device comprising:
a first terminal interfacing external entities in the form of an input where radio frequency signals are to be received,
at least one signal scaling unit having a first end where a signal provided by a terminal interfacing external entities is received, and
one signal detector provided for each signal scaling unit and being connected to a second end of the corresponding signal scaling unit for detecting a signal provided by this signal scaling unit,
wherein the signal scaling unit only includes passive reactive components and comprises an inductor and capacitor in series, and
wherein the signal scaling unit is further connected to a matching resistance at the connection point to the signal detector for matching the scaling unit to the detector, and
wherein the radio frequency signal handling device comprises at least two circulators connected between the amplifier and the output.

2. A radio frequency signal handling device according to claim 1 further comprising a filter between the signal scaling unit and the detector.

3. A radio frequency signal handling device according to claim 1 wherein it is a radio transmission device that further comprises an amplifier connected to the input for receiving said radio frequency signals to be transmitted, a second terminal interfacing external entities in the form of an output be connected to an antenna for transmitting these radio frequency signals.

4. A radio frequency signal handling device according to claim 3, wherein one signal scaling unit is with its first end connected between the amplifier and a circulator in order to receive a signal provided by the input and couple a fraction of this signal after being amplified to a connected detector.

5. A radio frequency signal handling device according to claim 3 wherein one signal scaling unit is with its first end connected between a circulator and a matching resistance in order to receive a signal provided by the output and couple a fraction of this signal to a connected detector.

6. A radio frequency handling device according to claim 1 wherein it is a signal attenuating device and the first end of the signal scaling unit is directly connected to the input in order to receive a signal from this terminal.

7. A radio frequency handling device according to claim 6, further comprising a matching resistance connected between ground and said input.

8. A mobile communication device comprising a radio frequency signal handling device according to claim 1.

9. A mobile communication device according to claim 8, wherein it is a base station.

10. A mobile communication device according to claim 8, wherein it is a mobile station.

* * * * *